United States Patent
Kerzabi et al.

(10) Patent No.: US 9,711,673 B2
(45) Date of Patent: Jul. 18, 2017

(54) DISPLAY DEVICE WITH PHOTOVOLTAIC CELLS INTEGRATED INTO THE SCREEN AND IMPROVED SCREEN LUMINOSITY AND REFLECTIVITY

(71) Applicant: SUNPARTNER TECHNOLOGIES, Aix en Provence (FR)

(72) Inventors: Badre Kerzabi, Aix en Provence (FR); Cyril Chappaz, Les Milles (FR); Alain Cenne, Peynier (FR); Sylvain De Vecchi, Marseilles (FR)

(73) Assignee: SUNPARTNER TECHNOLOGIES, Rousset (FR)

( * ) Notice: Subject to any disclaimer, the term of this patent is extended or adjusted under 35 U.S.C. 154(b) by 101 days.

(21) Appl. No.: 14/530,402

(22) Filed: Oct. 31, 2014

(65) Prior Publication Data
US 2015/0311373 A1 Oct. 29, 2015

(30) Foreign Application Priority Data
Apr. 25, 2014 (FR) ..................... 14 00984

(51) Int. Cl.
| | | |
|---|---|---|
| H01J 40/00 | (2006.01) |
| H01L 31/054 | (2014.01) |
| H01L 31/0224 | (2006.01) |
| G02B 19/00 | (2006.01) |
| H01L 31/042 | (2014.01) |
| H01L 31/153 | (2006.01) |
| H01L 33/00 | (2010.01) |
| G02F 1/133 | (2006.01) |

(52) U.S. Cl.
CPC ...... *H01L 31/0547* (2014.12); *G02B 19/0028* (2013.01); *G02B 19/0038* (2013.01); *G02B 19/0085* (2013.01); *H01L 31/022425* (2013.01); *H01L 31/042* (2013.01); *H01L 31/153* (2013.01); *H01L 33/00* (2013.01); *G02F 2001/13324* (2013.01); *Y02E 10/52* (2013.01)

(58) Field of Classification Search
CPC ......... H01L 31/0547; H01L 31/022425; H01L 31/0543
USPC .................................................. 313/523, 524
See application file for complete search history.

(56) References Cited

U.S. PATENT DOCUMENTS

| | | |
|---|---|---|
| 4,795,500 A | 1/1989 | Kishi et al. |
| 7,206,044 B2 | 4/2007 | Li et al. |
| 2002/0119592 A1 | 8/2002 | Oswald et al. |
| 2010/0245731 A1 | 9/2010 | Limketkai et al. |
| 2010/0284055 A1 | 11/2010 | Kothari et al. |

FOREIGN PATENT DOCUMENTS

| | | |
|---|---|---|
| EP | 1 174 756 A1 | 1/2002 |
| WO | WO 2009/052326 A2 | 4/2009 |
| WO | WO 2009/065069 A1 | 5/2009 |

(Continued)

*Primary Examiner* — Vip Patel
(74) *Attorney, Agent, or Firm* — Buchanan Ingersoll & Rooney PC

(57) ABSTRACT

A display device comprising at least: (a) a plurality of photovoltaic active areas and a plurality of holes, two neighboring photovoltaic active areas forming an opening; (b) one or more artificial light sources; (c) a plurality of light concentrators and reflective opaque disposed between said light sources and said photovoltaic active areas. This device wherein said hubs of light are arranged so that the light emitted from artificial light sources is directed by the light concentrators through the holes.

19 Claims, 10 Drawing Sheets

(56) References Cited

FOREIGN PATENT DOCUMENTS

Figure 1:
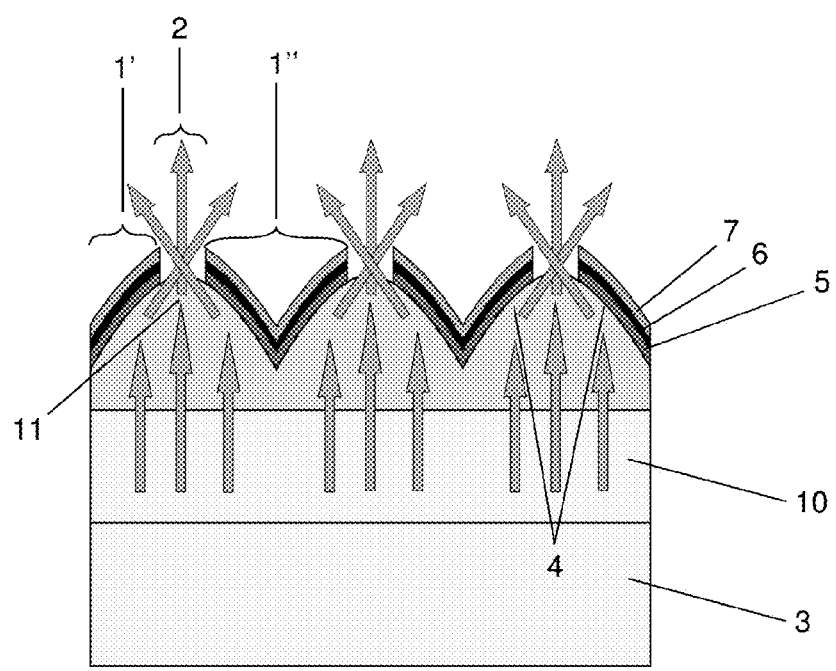

| | | |
|---|---|---|
| WO | WO 2009/098459 A1 | 8/2009 |
| WO | WO 2012/104503 A1 | 8/2012 |
| WO | WO 2013/054010 A1 | 4/2013 |

DISPLAY DEVICE WITH PHOTOVOLTAIC CELLS INTEGRATED INTO THE SCREEN AND IMPROVED SCREEN LUMINOSITY AND REFLECTIVITY

TECHNICAL FIELD OF THE INVENTION

The present invention relates to emissive display screens, and more particularly to the backlit display screens of nonportable or portable electronic devices, having photovoltaic cells integrated into the screen.

PRIOR ART

In the present invention, the expression "display device" refers to an electronic device equipped with a screen that allows a luminous message or image to be displayed by a suitable guidance of the light generated by said device. Display screens comprising backlit image zones are widely used in portable electronic devices. The expression "backlit image zone" is understood to mean an image zone that is located in front of a light source that illuminates it from behind. The "image zone" may for example be a pixel, a plurality of pixels or one portion of a pixel (a liquid-crystal pixel for example), or even a strip of film on which an image has been printed. In a backlit screen, a diffuse light source is placed upstream of the plane of the pixels, in order to improve the contrast of the image, the term "upstream" referring to the optical path of the light emitted by the device.

Portable devices are generally supplied with power by batteries and the lifetime of these batteries is a major factor affecting the user-friendliness of the device. In order to increase this lifetime, solar cells have been integrated into certain of these portable devices. They produce some of the current required for said device to function. Insofar as there is very little available space in which to place the solar cells on the external surface of said portable devices, it would be desirable to integrate the solar cells into the display screen itself.

The prior art contains a certain number of examples of such integration. A first approach, described in documents EP 1 174 756, U.S. Pat. No. 7,206,044, WO 2009/052326, US 2010/284055, WO 2009/065069 and US 2010/245731 consists in depositing semitransparent photovoltaic cells. Another approach, described in documents US 2002/0119592, U.S. Pat. No. 4,795,500 and WO 2009/098459 consists in depositing photovoltaic layers in the form of strips between which the light originating from the pixels passes. All these approaches lead to screens that are either not very bright, or for which the area of the photovoltaic cells, which is, for a given type of cell, proportional to the converted energy, is small.

Recently, these backlit screen systems equipped with photovoltaic strips integrated into the display face have been the starting point for a significant improvement involving the use of lenticular arrays, such as described in documents WO 2012/104503 and WO 2013/054010, capable of focusing the light originating from the pixels of the backlit screen between the photovoltaic strips and thus increasing, for a given fractional area of the photovoltaic strips, the luminosity of the screen.

Nevertheless, the lenticular arrays used in the known documents of the prior art are not the most effective optical systems for productively concentrating the light emitted by the device, i.e. for focusing an incident light beam onto a point-like region of space. Moreover, the manufacturing tolerances of such a lenticular array, especially regarding the residual thickness between the lenses and the semitransparent photovoltaic module, and the alignment of respective transparent zones of the photovoltaic module relative to the micro-lenses, are very small. In addition, the material from which the lenticular array is made has a calibrated refractive index that increases cost and creates process constraints. Lastly, the optical adhesives of different refractive indices to that of the lenticular array, which are used as adhesives to assemble the lenticular array in the screen, cause, at the various refractive index differences, losses in transmission of the light emitted by the device, and parasitic reflections of ambient light from the screen.

Simultaneously solving all of the aforementioned problems would therefore make it possible to increase the quality of the displayed images, by decreasing the reflection of ambient light from the surface of the optical system and by improving the transmission of the light emitted by the device, while decreasing manufacturing costs associated with the use of a number of optical resins and to the low dimensional tolerances.

The present invention therefore aims to remedy these drawbacks by making provision for the integration of opaque and reflective concentrators, in place of the transparent lenticular array, into the optical device.

SUBJECT MATTER OF THE INVENTION

The subject matter of the invention relates to a display device and to a number of processes for producing one portion of the device, such as defined in the claims which are integrated here by reference.

The display device according to the invention comprises at least:

(a) a plurality of photovoltaic active zones and a plurality of orifices, two neighboring photovoltaic active zones forming one orifice;

(b) one or more sources of artificial light; and (c) a plurality of opaque and reflective concentrators of light, said concentrators being placed between said light sources and said photovoltaic active zones.

Said device is noteworthy in that said concentrators of light are arranged so that the light emitted by the sources of artificial light is directed by the concentrators of light through the orifices.

The plurality of photovoltaic active zones may form a single photovoltaic cell or a set of cells electrically connected in series or in parallel in order to form a photovoltaic module. It may also be a question of a plurality of independent modules or cells. Generically, the expression "photovoltaic module" will be used below to refer to any one of these configurations. Said photovoltaic active zones may be active on one or more sides and are made up of one or more active materials that may be inorganic or organic, crystalline or amorphous or opaque or semitransparent. These active materials are advantageously thin layers based on amorphous or microcrystalline silicon, GaAs (gallium arsenide), CdTe (cadmium telluride), CIGS (copper/indium/gallium/selenium), CZTS (copper/zinc/tin/selenium) or based on polymers. It may be a question of p-i-n or p-n junctions or even of tandem cells, tandem cells comprising two superposed cells that preferentially absorb a different portion of the electromagnetic spectrum. They may be designed to convert visible light and/or ultraviolet light and/or infrared light into electricity.

The expression "concentrator of light" refers to an optical concentrator able to collect light from light beams having various angles of incidence on a region of space called the "entrance area" in order to guide them towards a smaller area called the "exit area" and generally corresponding to the top of the concentrator. The degree of concentration of the concentrator of light is then defined as the ratio of the exit area to the entrance area. Said concentrators may be made up of one or more planar, concave or convex, parabolic, semi-cylindrical or cylindro-parabolic surfaces. In the present invention, the concentrators of light allow the light generated by the display device to be guided through the orifices of a photovoltaic module, so as to increase, for a given fractional photovoltaic active zone area, the luminosity of said device. Thus, the tops of the concentrators must be positioned facing the orifices of the photovoltaic module such that most of the light focused by said concentrators is emitted through the photovoltaic active zones via the transparent orifices.

In various embodiments of the device the surfaces of said concentrators are made of metal, for example of aluminum, silver or molybdenum, or are colored, for example colored white, or are made up of carbon-based materials, for example of graphene or graphite, and are smooth or polished. As a result, these concentrators promote specular reflection of the incident light rather than diffuse reflection or absorption, the nature of the reflection depending closely on the quality of said surfaces. The reflection is said to be specular when an incident ray gives rise to a single reflected ray. Ideally, all of the energy of the incident ray is found in the reflected ray. Once interface defects are smaller or of the order of magnitude of the wavelength of the received light in size, the surfaces tend to become perfectly reflective. Advantageously, the degree of specular reflection from the surface of the concentrators must be higher than 90% of the incident light.

According to one variant embodiment, the material from which the surface of the concentrators is made is an electrical conductor that also serves as an electrode for the photovoltaic active zones. Thus, this combination of the reflective surface of the concentrator and one of the two electrodes of the photovoltaic module allows the number of layers of the device to be decreased, and thus its thickness to be minimized.

According to a certain embodiment of the device according to invention, said photovoltaic active zones are positioned in the vicinity of the tops of said concentrators of light. This configuration optimizes the amount of light transmitted through the orifices of the photovoltaic module, by limiting the amount of light emitted by the device that could be reflected or absorbed by the photovoltaic active zones.

According to another embodiment, said photovoltaic active zones cover and are conformal to the surface of the concentrators of light. The advantage of this configuration is that it maximizes the visible area of the photovoltaic active zones, and therefore potentially maximizes the electrical production generated by the photovoltaic module.

According to one additional variant embodiment of the device, said photovoltaic active zones and said concentrators are organized into a continuous or discontinuous array of elementary patterns bounding any type of shape, in particular curved shapes, cylindrical shapes for example, planar shapes, polygonal shapes for example, hexagonal shapes or prismatic shapes.

According to adopted embodiments, said sources of artificial light may emit white or colored light. These light sources may be made up of one or more, generally white, light-emitting diodes (LEDs) located directly opposite the device of the invention, or indeed on the side of a transparent waveguide through which the light is propagated. It may also be a question of organic or inorganic electroluminescent sources that preferably emit in one portion of the spectrum of the visible, and that are therefore colored.

According to an additional variant embodiment (not shown) the concentrators are textured level with areas that are in the vicinity of the tops of said concentrators and that correspond to the orifices. Texturing the surfaces at the top of said concentrators makes it possible to minimise reflection of light at the interfaces between two optical media of different refractive indices, and thus to maximize the amount of light emitted through said concentrators.

In one particular embodiment (not shown) the display device according to the invention furthermore comprises a collimating device able to direct the light emitted by the light sources in a preferred direction. Specifically, all the concentrators have a constrained cone of acceptance of incident light, i.e. an angle of incidence limit beyond which the incident light is no longer focused but expelled from the optical system. This acceptance cone depends on the shape of the concentrators and as the degree of concentration increases, i.e. as the ratio of the entrance area of the light flux to the exit area of the light flux increases, this acceptance cone becomes more and more limited. A device for collimating the incident light allows the direction, and therefore the angle of incidence of the light emitted by the device, to be controlled so that it advantageously corresponds to the acceptance cone of the concentrators even when this current is narrow. Combining a collimating device with the device of the invention therefore makes it possible to maximize the degree of concentration. Thus, for a given fractional photovoltaic active zone area, the amount of light that is transmitted by the concentrators through the orifices of the photovoltaic module is increased.

Here, the expression "collimating device" refers either to an independent optical system that allows the light flux originating from a point source to be redirected or indeed to an optical light guide with a structured surface (in this case, the collimating device is directly coupled to the waveguide that emits the light).

In another particular embodiment (not shown) the display device according to the invention furthermore comprises one or more color filters. Depending on the display technology, these color filters or pixels, typically a repetition of three elementary red, green and blue filters, may be associated side-by-side or stacked, called additive RGB or subtractive CMJ technologies, respectively, as is known in the art. The additive RGB technology is for example used in liquid-crystal display devices, whereas the subtractive CMJ technology is implemented in devices using electrowetting type technologies.

In another particular embodiment (not shown) the display device according to the invention furthermore comprises one or more electrooptical modulators and/or polarizers. It may for example be a question of organic polarizers or wire-grid polarizers and of liquid-crystal modulators or even electrowetting modulators.

In yet another particular embodiment (not shown) the display device according to the invention furthermore comprises a functional surface, for example an antireflection, anti-UV or touch-sensitive surface.

According to a first example process for manufacturing a portion of the device, said portion being composed of the concentrators and photovoltaic active zones:

(a) a transparent sheet is provided;

(b) said transparent sheet is structured by removing or depositing material so as to give it a structure that represents the shape of the concentrators;

(c) a conformal layer of a reflective material is deposited on the structured face of said transparent sheet;

(d) the reflective layer is etched at the tops of the concentrators;

(e) a semitransparent photovoltaic module composed of a plurality of photovoltaic active zones and a plurality of orifices is independently provided, said photovoltaic active zones being made up of a plurality of thin layers deposited on a transparent substrate; and (f) said semitransparent photovoltaic module is fastened to the module made up of the etched concentrators, the orifices of the photovoltaic module being precisely aligned with the tops of the concentrators.

In this manufacturing process, the transparent sheet may be structured under UV irradiation using textured stamps or rollers that imprint an array of shapes into a light-sensitive liquid or semi-liquid polymer, or by embossing a solid transparent material. The fastening step implements welding or adhesive bonding using an optical adhesive of refractive index advantageously comprised between that of the transparent sheets and substrate provided. Said substrate and sheets are made of a solid transparent material such as glass or even a polymer such as PMMA, PET or polycarbonate, and may be rigid or flexible.

According to a second example process for manufacturing a portion of the device, said portion being composed of the concentrators and photovoltaic active zones:

(a) a transparent sheet is provided;

(b) said transparent sheet is structured by removing or depositing material so as to give it a structure that represents the shape of the concentrators;

(c) starting with a reflective and electrically conductive layer, a plurality of conformal thin layers that are constituents of the photovoltaic module are deposited in succession on the structured face of said transparent sheet; and (d) all of the thin layers are etched in succession at the tops of the concentrators.

According to a third example process for manufacturing a portion of the device, said portion being composed of the concentrators and of the photovoltaic active zones:

(a) a transparent sheet is provided;

(b) said transparent sheet is structured by removing or depositing material so as to give it a structure that represents the shape of the concentrators;

(c) a planarizing reflective layer is deposited on the structured face of said transparent sheet, said planarizing reflective layer completely filling said structured face;

(d) at least two constituent thin layers of the photovoltaic module are deposited in succession on said planarizing reflective layer; and (e) at least two of the thin layers of the photovoltaic module and the reflective planarizing layer are etched in succession at the tops of the concentrators.

In a preferred embodiment, the planarizing reflective layer may be electrically conductive and serve as an electrode for the photovoltaic module. One electrode of the photovoltaic module and the reflective portion of the concentrator are then combined. Alternatively, in addition to the reflective layer a plurality of thin layers may be deposited one of these layers serving as the back electrode of the photovoltaic module.

According to a fourth example process for manufacturing a portion of the device, said portion being composed of the concentrators and photovoltaic active zones:

(a) a photovoltaic module made up of a plurality of thin layers deposited continuously on a transparent substrate is provided;

(b) a film made up of an advantageously light- or heat-sensitive solid or liquid material is deposited;

(c) said film is structured, for example using a mould or a laser, so as to give it a structure that represents the shape of the concentrators;

(d) said film is uniformly etched so that its local thickness in the vicinity of the tops of the concentrators is zero;

(e) a conformal layer of a reflective material is deposited on said film; and (f) the reflective layer and at least two of the thin layers of the photovoltaic module are etched in succession at the tops of the concentrators.

According to a fifth and last example process for manufacturing a portion of the device, said portion being composed of the concentrators and photovoltaic active zones:

(a) a photovoltaic module made up of a plurality of thin layers deposited continuously on a transparent substrate is provided;

(b) a film made up of an advantageously light- or heat-sensitive solid or liquid material is deposited;

(c) said film is structured, for example using a mould or a laser, so as to give it a structure that represents the shape of the concentrators;

(d) said film is uniformly etched so that its local thickness in the vicinity of the tops of the concentrators is zero;

(e) two thin layers of the photovoltaic module are etched in succession at the tops of the concentrators;

(f) a conformal layer of a transparent dielectric material is deposited on said film and in the orifices of the photovoltaic module while letting apertures form in the dielectric layer in the orifices; and (g) a conformal layer of an electrically conductive and reflective material is deposited on said layer so that only certain orifices are covered, and so that the conductive material makes electrical contact with the transparent electrode of the photovoltaic module in the corresponding apertures.

In one particular embodiment (not shown) the emissive screen, which is placed on one side of the display device of the invention, may be combined with a reflective screen on the opposite side of said device, in which the reflective surfaces of the concentrators are used as mirrors to reflect ambient light and to display information. In such a device, certain elements serving in the display of the emissive screen and of the reflective screen, such as the electrooptical modulators, color filters or even polarizers, may be combined.

The principal applications of the invention are in non-portable or portable, rigid or flexible electronic appliances that comprise a display device according to the invention. The invention is particularly suitable for the emissive display screens of electronic appliances such as cell phones, watches, tablets, computers, televisions, human-machine interfaces, electronic signs, or even electronic billboards.

FIGURES

Figure 3A:
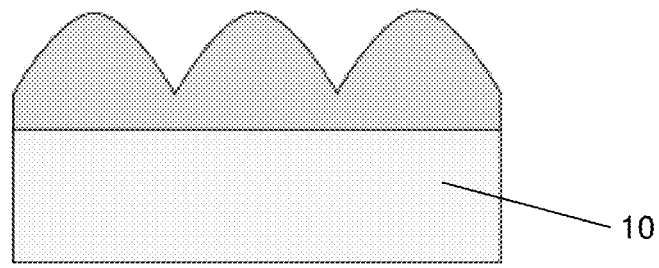
Figure 3B:
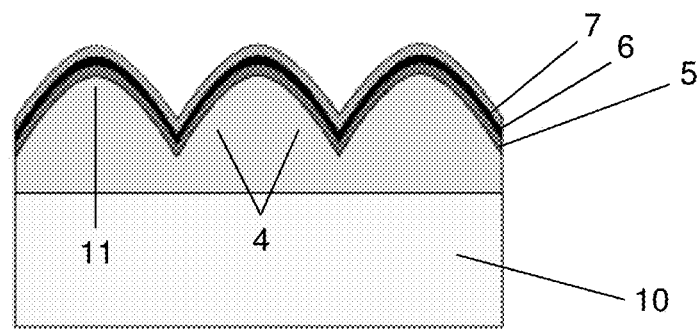
Figure 3C:
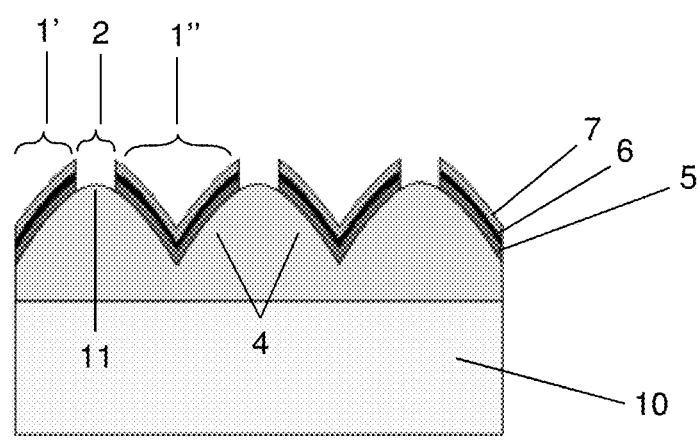
Figure 4A:
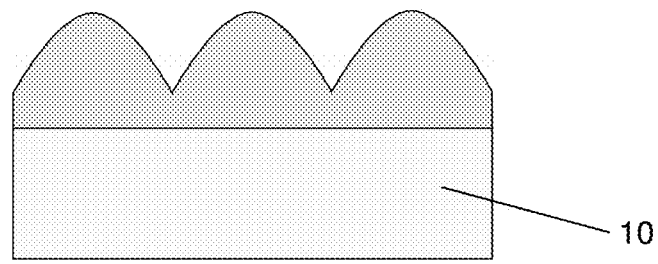
Figure 4B:
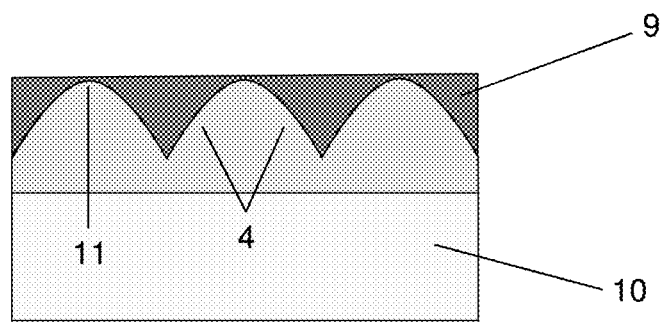
Figure 4C:
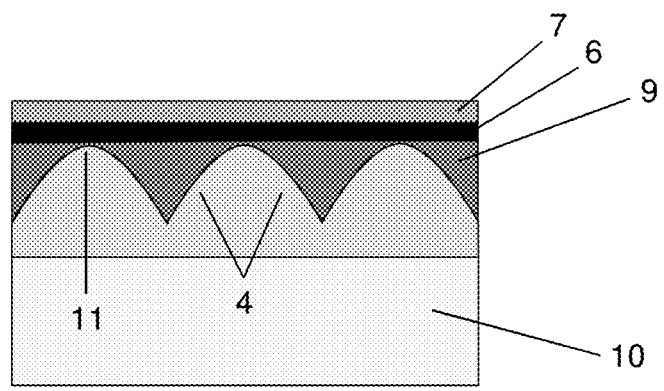
Figure 4D:
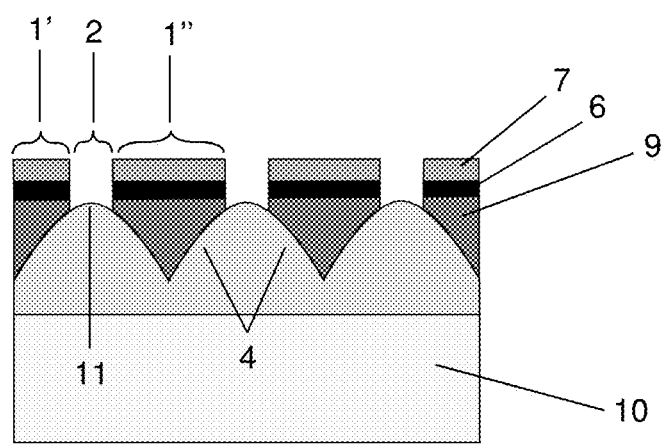

The invention will be better understood from its detailed description, given with regard to the figures in which:

FIG. 1 schematically shows the structure of a display device according to the invention in cross section;

FIGS. 2a, 2b, 2c and 2d schematically show objects that illustrate various steps of a first process for manufacturing one portion of the display device according to the invention in cross section;

FIGS. 3a, 3b and 3c schematically show objects that illustrate various steps of a second process for manufacturing one portion of the display device according to the invention in cross section;

FIGS. 4a, 4b, 4c and 4d schematically show objects that illustrate various steps of a third process for manufacturing one portion of the display device according to the invention in cross section;

FIGS. 5a, 5b, 5c, 5d and 5e schematically show objects that illustrate various steps of a fourth process for manufacturing one portion of the display device according to the invention in cross section; and FIGS. 6a, 6b, 6c, and 6d schematically show objects that illustrate various steps of a fifth process for manufacturing one portion of the display device according to the invention in cross section and then from above.

The figures are not to scale, the relatives thicknesses of the components of the device being intentionally exaggerated in order to better show its structure.

DETAILED DESCRIPTION

With reference to FIG. 1, which corresponds to a schematic cross-sectional view of the display device according to the invention comprising: a plurality of photovoltaic active zones 1 and a plurality of orifices 2, two neighboring photovoltaic active zones 1', 1" forming one orifice 2; a source 3 of artificial light; and a plurality of opaque and reflective parabolic-shaped concentrators 4 placed between said light sources 3 and said photovoltaic active zones 1. Said parabolic concentrators 4 are arranged so that the light emitted by the sources 3 of artificial light is directed by the concentrators 4 of light through the orifices 2.

Figure 2A:
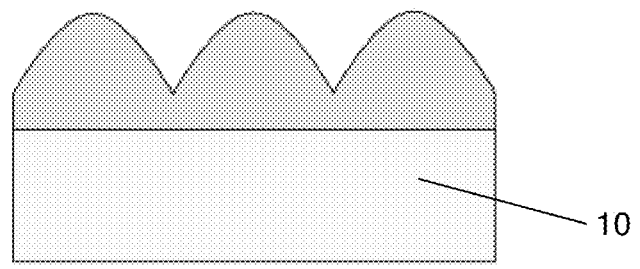
Figure 2B:
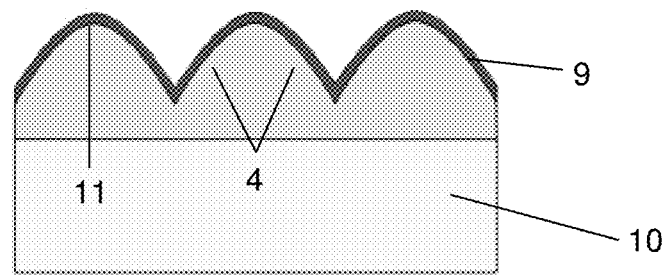
Figure 2C:
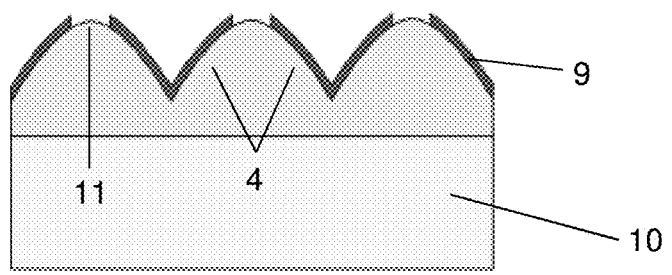
Figure 2D:
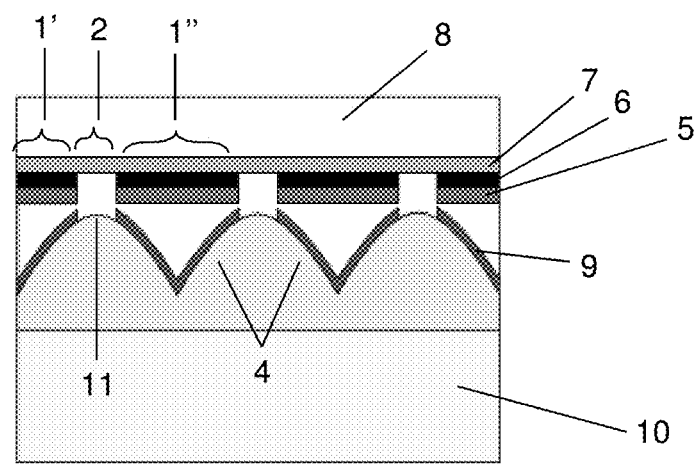

FIGS. 2a, 2b, 2c and 2d schematically show a plurality of objects that illustrate various steps of a first process for manufacturing one portion of the display device according to the invention in cross section. The first steps consist in providing a transparent sheet 10 and in structuring said transparent sheet 10 by moulding a layer of material deposited on its surface so as to produce in it the shape of parabolae (FIG. 2a). The following step consists in depositing a conformal layer of a reflective material 9 on the structured face of said transparent sheet 10 in order to obtain parabolic concentrators 4 (FIG. 2b). Next, the reflective layer 9 is etched at the tops 11 of the parabolic concentrators 4 (FIG. 2c). In parallel, a semitransparent photovoltaic module composed of a plurality of photovoltaic active zones 1 and a plurality of orifices 2, two adjacent photovoltaic active zones 1, 1' bounding one orifice 2 is independently provided. Said photovoltaic active zones 1 are made up of a plurality of thin layers 5, 6, 7 deposited on a transparent substrate 8. The layer 7 is a transparent electrode that may be a wafer-scale layer (i.e. it is present in the orifices as shown in FIG. 2d) or it may be structured so that the orifices do not contain the layer 7 (not shown here), whereas the absorber layer 6 and the metal electrode 5 are opaque. Lastly, said semitransparent photovoltaic module is fastened to the module made up of the etched parabolic concentrators 4 by adhesive bonding, the orifices 2 of the photovoltaic module being precisely aligned with the tops 11 of the parabolic concentrators 4 (FIG. 2d).

A second manufacturing process allowing one portion of the display device schematically shown in FIG. 1 to be produced is now described. The two first steps of this process (FIG. 3a) are identical to those described with reference to FIG. 2a. Next, starting with a reflective and electrically conductive layer 5, a plurality of conformal thin layers 5, 6, 7 that are constituents of the photovoltaic module are deposited in succession on the structured face of said transparent sheet 10 (FIG. 3b). The last step consists in etching all of the thin layers 5, 6, 7 in succession at the tops 11 of the parabolic concentrators 4 (FIG. 3c).

The various steps of one variant of the manufacturing process just described are illustrated in FIGS. 4a, 4b, 4c and 4d. The two first steps of this process (FIG. 4a) are again identical to those described with reference to FIG. 2a. Next, a first planarizing reflective layer 9 that completely fills said structured face (FIG. 4b), then in succession two thin layers 6, 7 that make up, with the layer 9, a photovoltaic module are deposited on the structured face of said transparent sheet 10. Lastly, the thin layers 6, 7 and the reflective layer 9 are etched in succession at the tops 11 of the parabolic concentrators 4.

Figure 5A:
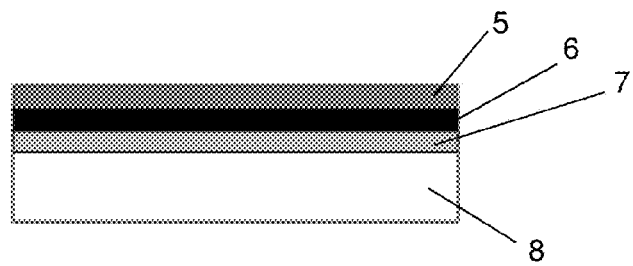
Figure 5B:
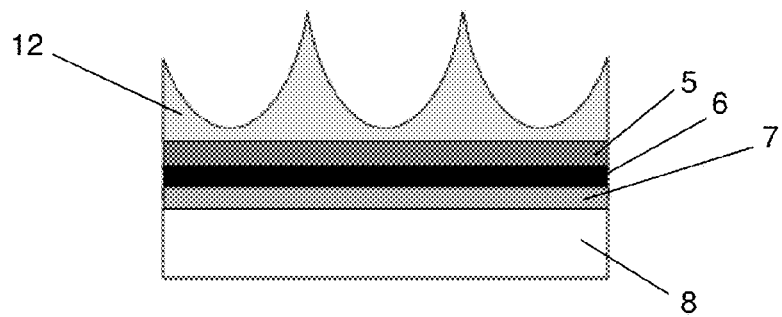
Figure 5C:
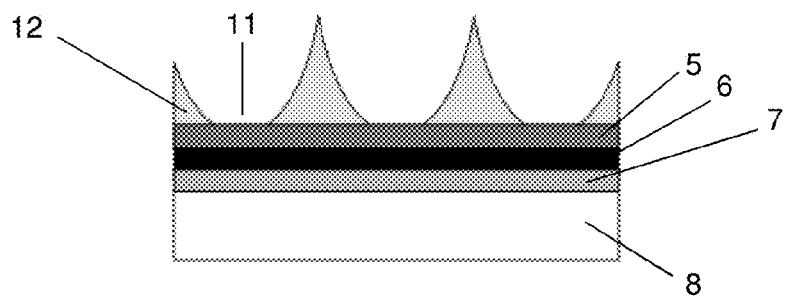
Figure 5D:
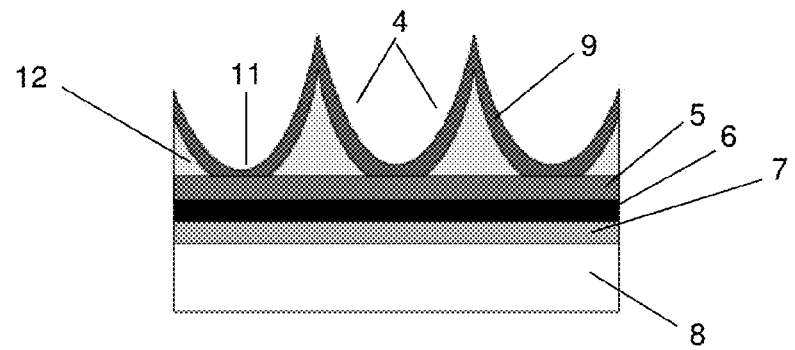
Figure 5E:
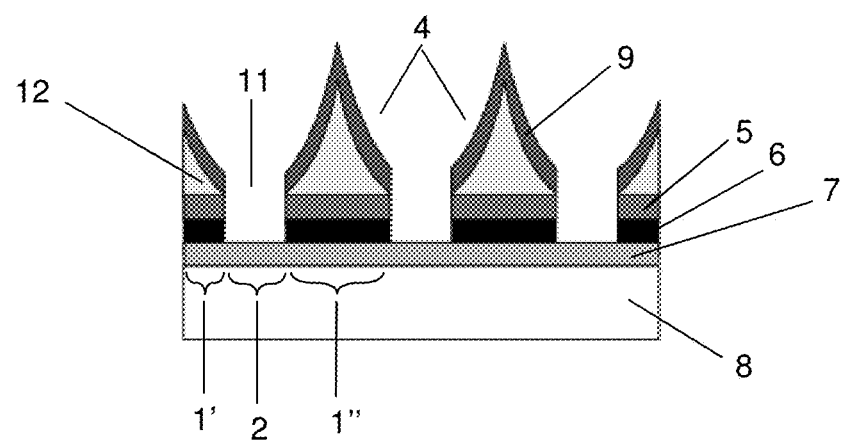

A fourth manufacturing process allowing one portion of the display device according to the invention to be produced is now described. The first step consists in providing a photovoltaic module made up of a plurality of thin layers 5, 6, 7 deposited continuously on a transparent substrate 8 (FIG. 5a). Next, a film 12 is deposited and then structured, for example using a mould or a laser, so as to produce in it negative parabolic shapes (FIG. 5b). The following step consists in uniformly etching said film 12 so that its local thickness in the vicinity of the tops 11 of the future parabolic concentrators 4 is zero (FIG. 5c). Next, a conformal layer of a reflective material 9 is deposited on said film 12 (FIG. 5d). Lastly, the reflective layer 9 and at least two 5, 6 of the thin layers of the photovoltaic module are etched in succession at the tops 11 of the parabolic concentrators 4 (FIG. 5e).

Figure 6A:
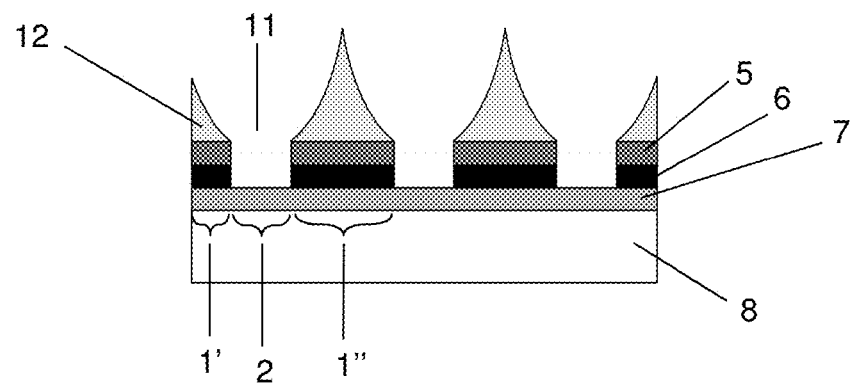
Figure 6B:
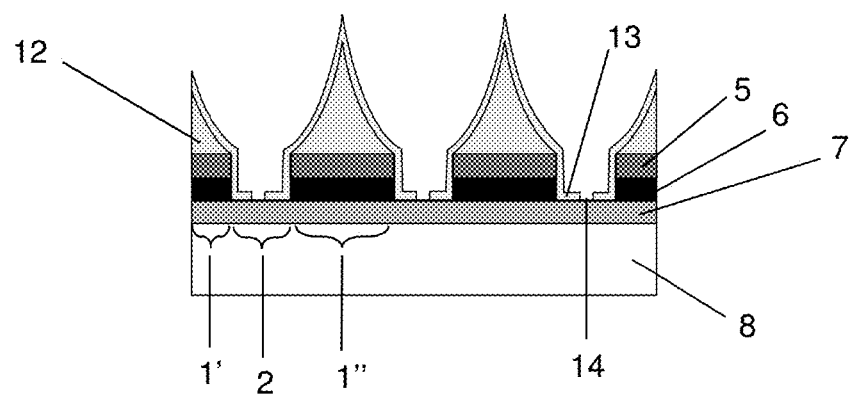
Figure 6C:
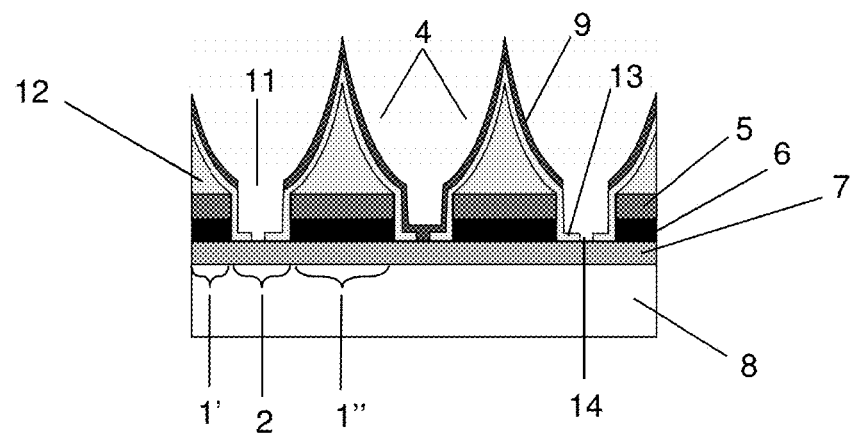
Figure 6D:
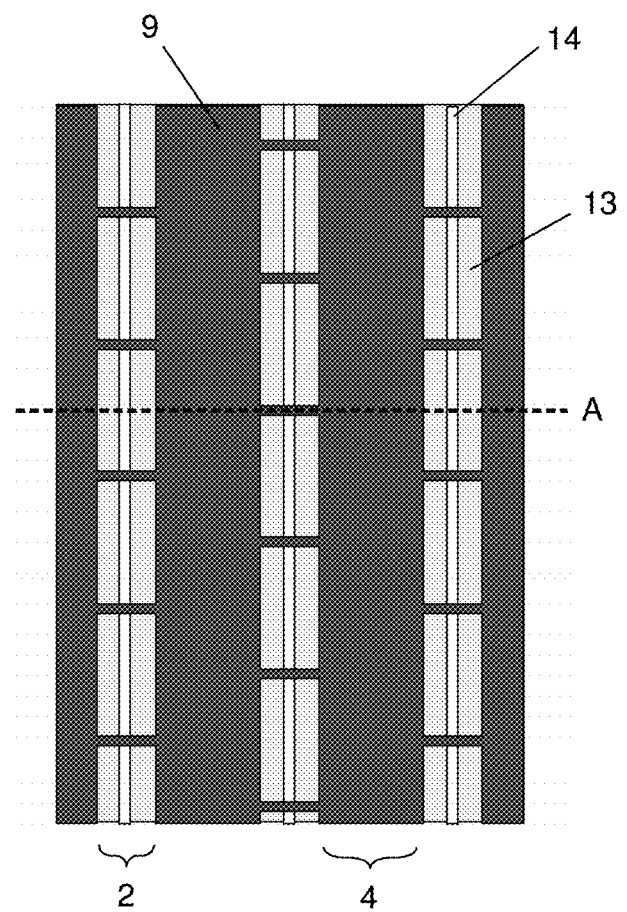

FIGS. 6a, 6b and 6c schematically show, in cross section, a plurality of objects that illustrate the three last steps of a fifth process for manufacturing a portion of the display device according to the invention, the three first steps of said process being identical to those shown in FIGS. 5a, 5b and 5c. The step illustrated in FIG. 6a consists in etching in succession the two thin layers 5, 6 of the photovoltaic module at the tops 11 of the parabolic concentrators 4. Next, a thin conformal layer of a transparent dielectric material 13 is deposited on the film 12 and in the orifices 2 of the photovoltaic module while letting apertures 14 form in the layer 13 in said orifices 2 (FIG. 6b). The last step is illustrated both in FIGS. 6d (top view) and 6c (cross-sectional view of the plane indicated by the dotted line in FIG. 6d). It consists in depositing a conformal layer of an electrically conductive and reflective material 9 on said layer 13 so that only certain orifices 2 are covered, and so that the material 9 makes electrical contact with the transparent electrode 7 of the photovoltaic module in the corresponding apertures 14. This layer 9 both allows the parabolic concentrators 4 to be formed and the electrical charge collected by the transparent electrode 7 in the photovoltaic active zones 1 to be transported, while minimising the visibility of this opaque layer 9 level with the orifices 2.

ADVANTAGES OF THE INVENTION

It follows from the above that the invention achieves its design goals. The invention teaches an electronic display device including integrated photovoltaic cells comprising opaque and reflective optical elements that are able to effectively concentrate light emitted by light sources of the device through transparent zones of the photovoltaic module.

Relative to the prior art, the device of the invention has the advantage of increasing the quality of the images displayed by decreasing the reflection of ambient light from the surface of the optical system and by increasing transmission of the light emitted by the device, for a given fractional photovoltaic zone area. The device of the invention furthermore allows manufacturing cost to be decreased, as certain steps of the production process may be combined, and dimensional tolerances to be improved.

LIST OF THE REFERENCES USED IN THE FIGURES

| | | | |
|---|---|---|---|
| 1 | Photovoltaic active zone | 7 | Transparent electrode |
| 2 | Orifice | 8 | Transparent substrate |
| 3 | Light source | 9 | Reflective layer |
| 4 | Concentrator of light | 10 | Transparent sheet |
| 5 | Metal electrode | 11 | Top of the concentrator |
| 6 | Absorber | 12 | Film |
| 13 | Transparent dielectric material | 14 | Aperture |

The invention claimed is:

1. A display device comprising at least:
   (a) a plurality of photovoltaic active zones and a plurality of orifices, two neighboring photovoltaic active zones forming one orifice;
   (b) one or more sources of artificial light; and
   (c) a plurality of opaque and reflective concentrators of light, said concentrators being placed between said light sources and said photovoltaic active zones,
   wherein said concentrators of light are arranged so that the light emitted by the sources of artificial light is directed by the concentrators of light through the orifices.

2. The display device as claimed in claim 1, wherein said concentrators are made up of one or more planar, concave or convex, parabolic, semi-cylindrical or cylindro-parabolic surfaces.

3. The display device as claimed in claim 1, wherein the surfaces of said concentrators are made of metal, for example of aluminum, silver or molybdenum, or are colored, for example colored white, or are made up of carbon-based materials, for example of graphene or graphite, and in that they are smooth or polished.

4. The display device as claimed in claim 1, wherein the material from which the surface of the concentrators is made is an electrical conductor that also serves as an electrode for the photovoltaic active zones.

5. The display device as claimed in claim 1, wherein said photovoltaic active zones are positioned in the vicinity of the tops of said concentrators of light.

6. The display device as claimed in claim 1, wherein said photovoltaic active zones cover and are conformal to the surface of the concentrators of light.

7. The display device as claimed in claim 1, wherein said photovoltaic active zones and said concentrators are organized into a continuous or discontinuous array of elementary patterns bounding any type of shape, in particular curved shapes, cylindrical shapes for example, planar shapes, polygonal shapes for example, hexagonal shapes or prismatic shapes.

8. The display device as claimed in claim 1, wherein said sources of artificial light emit white or colored light.

9. The display device as claimed in claim 1, wherein said concentrators are textured level with areas that are in the vicinity of the tops of said concentrators and that correspond to the orifices.

10. The display device as claimed in claim 1, wherein it furthermore comprises a collimating device able to direct the light emitted by the light sources in a preferred direction.

11. The display device as claimed in claim 1, wherein it furthermore comprises one or more color filters.

12. The display device as claimed in claim 1, wherein it furthermore comprises one or more electrooptical modulators and/or polarizers.

13. The display device as claimed in claim 1, wherein it furthermore comprises a functional surface, for example an antireflection, anti-UV or touch-sensitive surface.

14. A process for manufacturing a portion of the display device as claimed in claim 1, said portion being composed of the concentrators and of the photovoltaic active zones, wherein it comprises in succession steps consisting in:
   (a) providing a transparent sheet;
   (b) structuring said transparent sheet by removing or depositing material so as to give it a structure that represents the shape of the concentrators;
   (c) depositing a conformal layer of a reflective material on the structured face of said transparent sheet;
   (d) etching the reflective layer at the tops of the concentrators;
   (e) independently providing a semitransparent photovoltaic module composed of a plurality of photovoltaic active zones and a plurality of orifices, said photovoltaic active zones being made up of a plurality of thin layers deposited on a transparent substrate; and
   (f) fastening said semitransparent photovoltaic module to the module made up of the etched concentrators, the orifices of the photovoltaic module being precisely aligned with the tops of the concentrators.

15. A process for manufacturing a portion of the display device as claimed in claim 1, said portion being composed of the concentrators and of the photovoltaic active zones, wherein it comprises in succession steps consisting in:
   (a) providing a transparent sheet;
   (b) structuring said transparent sheet by removing or depositing material so as to give it a structure that represents the shape of the concentrators;
   (c) depositing in succession on the structured face of said transparent sheet a plurality of conformal thin layers that are constituents of the photovoltaic module, starting with a reflective electrically conductive layer; and
   (d) etching in succession all of the thin layers at the tops of the concentrators.

16. A process for manufacturing a portion of the display device as claimed in claim 1, said portion being composed of the concentrators and of the photovoltaic active zones, wherein it comprises in succession steps consisting in:
   (a) providing a transparent sheet;
   (b) structuring said transparent sheet by removing or depositing material so as to give it a structure that represents the shape of the concentrators;
   (c) depositing on the structured face of said transparent sheet a planarizing reflective layer that completely fills said structured face;
   (d) depositing in succession on said unetched planarizing reflective layer at least two constituent thin layers of the photovoltaic module; and
   (e) etching in succession at least two of the thin layers of the photovoltaic module and the reflective planarizing layer at the tops of the concentrators.

17. A process for manufacturing a portion of the display device as claimed in claim 1, said portion being composed of the concentrators and of the photovoltaic active zones, wherein it comprises in succession steps consisting in:
- (a) providing a photovoltaic module made up of a plurality of thin layers deposited continuously on a transparent substrate;
- (b) depositing a film made up of an advantageously light- or heat-sensitive solid or liquid material;
- (c) structuring said film, for example using a mould or a laser, so as to give it a structure that represents the shape of the concentrators;
- (d) uniformly etching said film so that its local thickness in the vicinity of the tops of the concentrators is zero;
- (e) depositing a conformal layer of a reflective material on said film; and
- (f) etching in succession the reflective layer and at least two of the thin layers of the photovoltaic module at the tops of the concentrators.

18. A process for manufacturing a portion of the display device as claimed in claim 1, said portion being composed of the concentrators and of the photovoltaic active zones, wherein it comprises in succession steps consisting in:
- (a) providing a photovoltaic module made up of a plurality of thin layers deposited continuously on a transparent substrate;
- (b) depositing a film made up of an advantageously light- or heat-sensitive solid or liquid material;
- (c) structuring said film, for example using a mould or a laser, so as to give it a structure that represents the shape of the concentrators;
- (d) uniformly etching said film so that its local thickness in the vicinity of the tops of the concentrators is zero;
- (e) etching in succession the two thin layers of the photovoltaic module at the tops of the concentrators;
- (f) depositing a conformal layer of a transparent dielectric material on said film and in the orifices of the photovoltaic module while letting apertures form in the layer in the orifices; and
- (g) depositing a conformal layer of an electrically conductive and reflective material on said layer so that only certain orifices are covered, and so that the material makes electrical contact with the transparent electrode of the photovoltaic module in the corresponding apertures.

19. A nonportable or portable, rigid or flexible electronic appliance comprising a display device as claimed in claim 1.

* * * * *